(12) United States Patent
Liu et al.

(10) Patent No.: US 7,499,336 B2
(45) Date of Patent: Mar. 3, 2009

(54) METHOD OF PROGRAMMING A NONVOLATILE MEMORY CELL AND RELATED MEMORY ARRAY

(75) Inventors: Yi-Ching Liu, Hsinchu (TW); I-Long Lee, Hsinchu (TW); Ming-Hung Chou, Hsinchu (TW); Fuja Shone, Hsinchu (TW)

(73) Assignee: Skymedi Corporation, Science Park, Hsinchu (TW)

( * ) Notice: Subject to any disclaimer, the term of this patent is extended or adjusted under 35 U.S.C. 154(b) by 88 days.

(21) Appl. No.: 11/748,459

(22) Filed: May 14, 2007

(65) Prior Publication Data

US 2008/0285342 A1    Nov. 20, 2008

(51) Int. Cl.
*G11C 16/04* (2006.01)

(52) U.S. Cl. .............. 365/185.28; 365/185.05; 365/185.21

(58) Field of Classification Search ............ 365/185.05, 365/185.21, 185.28
See application file for complete search history.

(56) References Cited

U.S. PATENT DOCUMENTS

| 5,414,693 | A | 5/1995 | Ma |
| 5,583,810 | A | 12/1996 | Van Houdt |
| 6,282,124 | B1 | 8/2001 | Van Houdt |
| 6,424,002 | B1* | 7/2002 | Kondo et al. ................. 257/316 |
| 6,566,707 | B1* | 5/2003 | Sudo et al. .................... 257/316 |
| 6,597,036 | B1* | 7/2003 | Lee et al. ...................... 257/316 |
| 7,057,931 | B2* | 6/2006 | Lutze et al. ............ 365/185.18 |

OTHER PUBLICATIONS

K. Naruke, et al., A New Flash-Erase EEPROM Cell With A Sidewall Select-Gate on its Source Side, IEEE, 1989, IEDM 89-603, Semiconductor Device Engineering Laboratory, Japan.
Hideaki Kurata, et al., Constant-Charge-Injection Programming: A Novel High-Speed Programming Method for Multilevel Flash Memories, IEEE Journal of Solid-State Circuits, Feb. 2005, pp. 523-531, vol. 40, No. 2.

* cited by examiner

*Primary Examiner*—Hoai V Ho
(74) *Attorney, Agent, or Firm*—Winston Hsu (57) ABSTRACT

A programming method for programming stored bits in floating gates of a flash memory cell or selected flash memory cells of a flash memory array is utilized for applying SSI injection on said flash memory cell or said selected flash memory cells of a flash memory array is disclosed. Constant charges at the drain regions of said flash memory cell or said selected flash memory cells of the flash memory array is implemented with a capacitor and a related switch for suppressing variant injected-charges-related properties in applying the SSI injection. A constant biasing current, which may be implemented with a constant current source or a current mirror equipped with a constant current source, is applied on source regions of said flash memory cell or said selected flash memory cells of the flash memory array for enhancing the suppression of said variant biasing properties.

13 Claims, 9 Drawing Sheets

METHOD OF PROGRAMMING A NONVOLATILE MEMORY CELL AND RELATED MEMORY ARRAY

BACKGROUND OF THE INVENTION

1. Field of the Invention

The present invention relates to a method of programming a nonvolatile memory cell and a related memory array, and more particularly, to a method of programming a flash memory cell and related flash memory array.

2. Description of the Prior Art

A prior art technology, which is called an MLC (multilevel cell) technology, is utilized for producing nonvolatile memory cells capable of storing at least two bits, especially for flash memory cells. In a flash memory cell produced from the MLC technology and called an MLC flash memory cell, data stored in the MLC flash memory cell is determined by various threshold voltage levels of the MLC flash memory cell. For example, in an MLC flash memory cell capable of storing two bits, it may take four types of threshold voltage levels for determining the stored data, and when it comes to three bits, it may take eight types of threshold voltage levels, etc. MLC technology enables storage of multiple bits per memory cell by charging the polysilicon floating gate of a transistor to different levels, or by charging the dielectric storing layer of a transistor to different levels, on both of which the structure of the MLC flash memory cell depends. MLC flash memory cells must be able to manage electrical charge precisely, and more specifically, the MLC flash memory cells must be able to place charge with precision, sense charge with precision, and store charge over time. Each MLC flash memory cell is made up of a single transistor, which is directly connected to appropriate control voltages in order to accomplish pinpoint accuracy in charge manipulation.

The abovementioned description is not only for a single MLC flash memory cell, but also for an MLC flash memory array comprising a plurality of MLC flash memory cell aligned in rows and columns. Therefore, the abovementioned description is also available for the MLC flash memory array in the following disclosure.

During programming, in an MLC flash memory array, each MLC flash memory cell through bit-line and word-line connection enables precise charge placement. A control gate of a flash memory cell links to an internally generated supply voltage of the MLC flash memory array through a direct word-line connection and row decoding. The drain of the MLC flash memory cell is pulsed at a constant voltage through a direct bit-line connection and column decoding. The source of the MLC flash memory cell is directly connected to ground. Electron storage on the floating gate of the MLC flash memory cell creates a potential that must be overcome by the control gate. This potential results in a higher turn-on threshold voltage for the MLC flash memory cell, which also is a transistor. Direct, precise gate and drain control is critical to MLC flash memory cell placement.

The MLC technology takes advantages of the multiple program bits in single MLC flash memory cell. When an MLC flash memory cell, or a MLC flash memory array, is applied with an adequate programming method, the MLC flash memory cell may have a well-reacting speed and precision in programming the bits stored in floating gates. There are some available programming methods of the prior art for programming in the MLC flash memory cell or the MLC flash memory array, however, the programming methods have respective benefits and defects corresponding to respective properties. For example, a first programming method is called Fowler-Nordheim tunneling (FN tunneling), a second programming method is called channel-hot-electron injection (CHE injection), and a third programming method is called source-side channel-hot-electron injection (SSI injection).

The FN tunneling is achieved by forcing electrons to or from the floating gate, which is achieved by applying a voltage between a control gate and the substrate of the MLC flash memory cell. By applying different types of voltage levels on the control gate coupled to a corresponding word line, the drain region coupled to a corresponding bit line, and the source region of the MLC flash memory cell, operations of the MLC flash memory cell, which include a write operation, a read operation, and an erase operation, are executed. The FN tunneling allows MLC flash memory cells of an MLC flash memory array to be programmed in parallel, thereby, a total throughput of programmed bits of the MLC flash memory array acquires a high programming efficiency. However, the FN tunneling takes a longer time in cell programming, which is at least 50 μs, caused from changing strong electric fields inside the MLC flash memory cell. Moreover, the programming characteristics about threshold voltage level distributions are not uniform enough because of variations of some related device parameters, for example, a gate-coupling ratio.

The CHE injection is achieved by generating hot electrons and is applied on simple stacked-gate devices. In the method, an MLC flash memory cell is switched on with a high voltage level at the control gate, and an intermediate voltage level at the drain region. Therefore, with the aid of a large electric field formed on a drain junction, electrons are accelerated by the electric field, and the hot electrons are thus generated. In a write operation of the MLC flash memory cell, the hot electrons are dragged with another electric field generated from the control gate to the floating gates. The CHE injection may achieve a high-speed cell programming and a uniform programming, however, the CHE injection has a low programming efficiency caused by the incompatibility between the position of the high vertical electric field and the position where hot-carriers are generated. Generally speaking, a magnitude of programming currents is required to be about or more than 100 μA per cell, and therefore, the number of simultaneously programmed MLC flash memory cells is few because of power limitations provided by internal pumping circuitry.

The SSI injection acquires a fast cell programming and a good programming parallelism. Note that a split gate structure is further applied in the SSI injection, and an additional select gate, which may be a sidewall gate of an MLC flash memory cell, is thus applied. For applying the SSI injection, the select gate has to be operated in a sub-threshold region of the MLC flash memory cell, and a pinch-off point appears at the boundary between the select gate and the floating gate. Since the select gate is utilized for enhancing generated hot electrons, a vertical electric field at the pinch-off point help inject hot electrons into the floating gate. A low channel current is required for applying the SSI injection. Since the select gate has to be operated in a sub-threshold region of the MLC flash memory cell, the channel current, which is denoted as $I_{ds}$, varies exponentially with linear variation in the threshold voltage level, which is denoted as $V_{th}$, of transistors formed under the select gate. If a charge injected into the floating gate is denoted as $Q_g$, then $Q_g$ may be expressed as:

$$Q_{fg} = \lambda \times I_{ds} \times t \qquad (1)$$

where λ represents a programming rate of the MLC flash memory cell and t represents time. Since variation of the channel current $I_{ds}$ is affected by the threshold voltage $V_{th}$ of the select gate exponentially, the programming speed λ thus significantly varies also, and it severely affects the preciseness and the programming performance of the SSI injection.

In aspects of an MLC flash memory cell, a flash memory cell utilizes a low power and is as small as possible to decrease a volume of a related integrated circuit.

Figure 1:
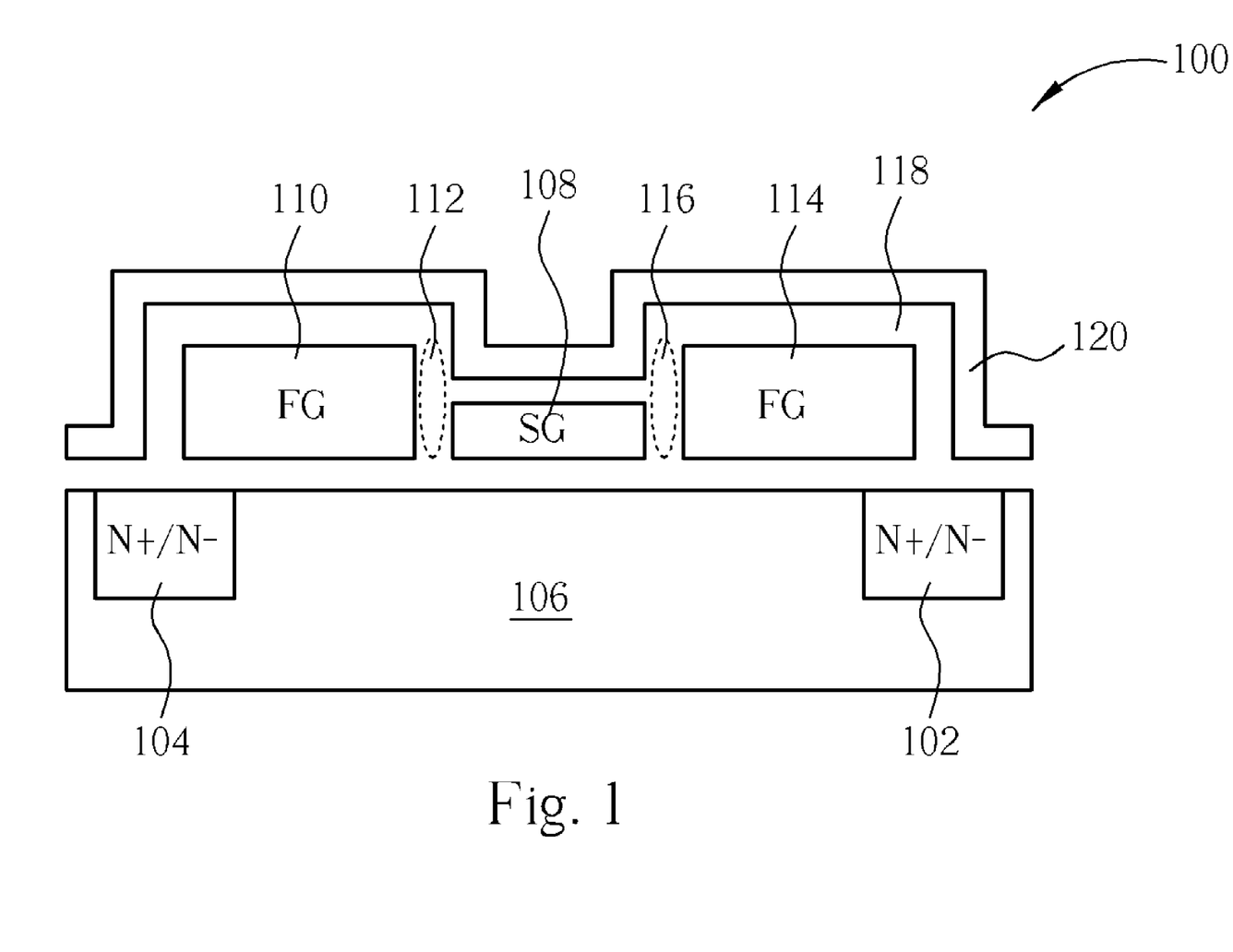
FIG. 1 is a diagram of a flash memory cell, which is generated according to the MLC technology of the prior art.

Please refer to FIG. 1, which is a diagram of a flash memory cell 100 of the prior art. The flash memory cell 100 is generated according to the MLC technology, and is formed between a drain region 102 and a source region 104 of a semiconductor substrate 106. The nonvolatile memory cell 100 comprises a select gate 108 formed above the semiconductor substrate 106, a first floating gate 110 formed at a first side of the select gate 108 and insulated from the select gate 108 with a first dielectric spacer 112, a second floating gate 114 formed at a second side of the select gate 108 and insulated from the select gate 108 with a second dielectric spacer 116, a first dielectric layer 118 formed on both of the first floating gate 110 and the second floating gate 114, and a control gate 120 formed on the first dielectric layer 118 and being substantially perpendicular to both of the first doping region 102 and the second doping region 104. The first and second floating gates 110 and 114 are utilized for storing programmed bits to implement said MLC technology.

Figure 2:
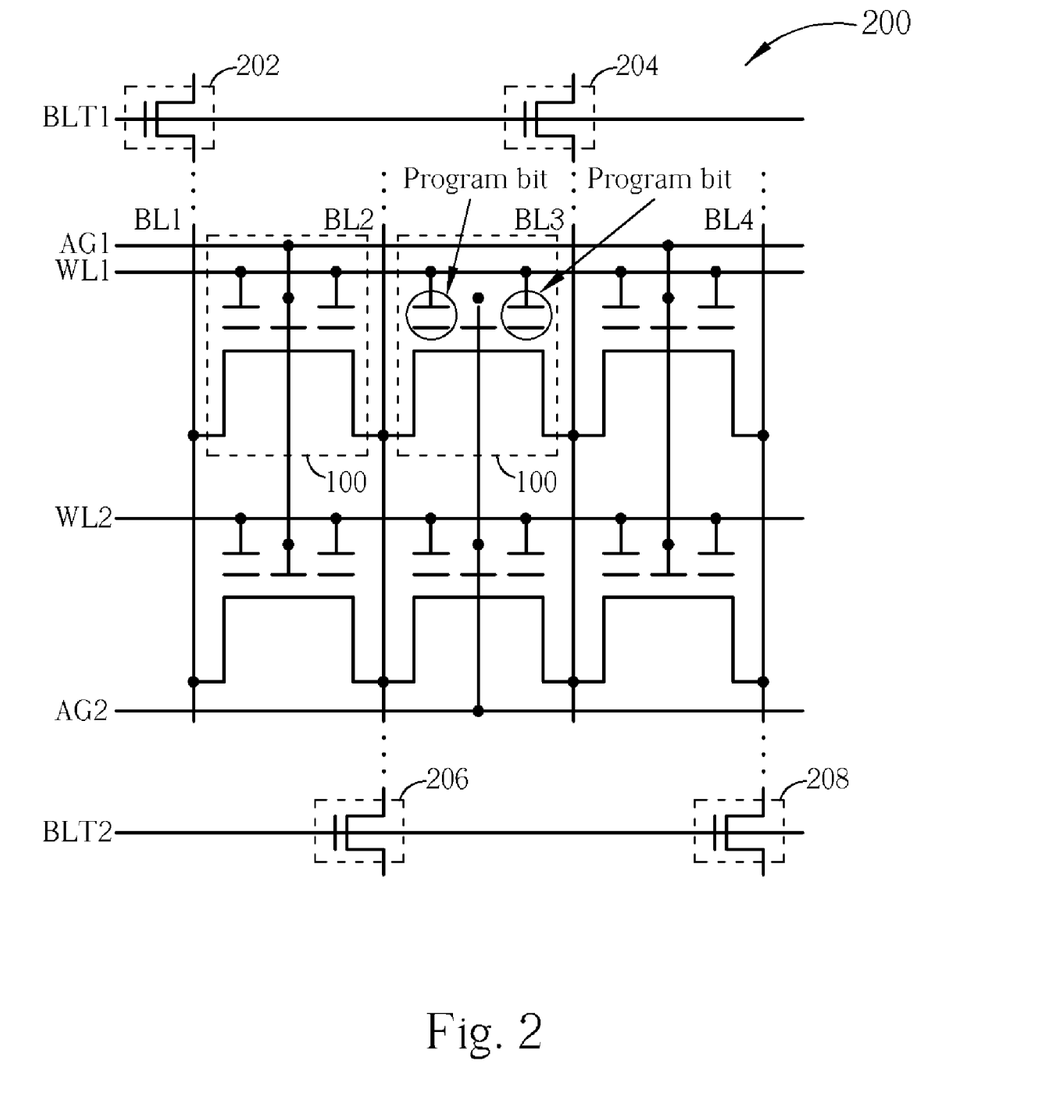
FIG. 2 is a diagram of an exemplary flash memory array comprising a plurality of the flash memory cells shown in FIG. 1 and arranged in rows and columns.

Please refer to FIG. 2, which is a diagram of an exemplary flash memory array 200 comprising a plurality of the flash memory cells 100 shown in FIG. 1 and arranged in rows and columns. In addition to the plurality of the flash memory cells 100, the flash memory array 200 also comprises a first bit source line BLT1 and a second bit source line BLT2, a first word line WL1 and a second word line WL2, a first assist gate AG1 and a second assist gate AG2, a first bit line BL1, a second bit line BL2, a third bit line BL3, a fourth bit line BL4, a first odd transistor 202, a second odd transistor 204, a first even transistor 206, and a second even transistor 208. The plurality of flash memory cells 100 in the flash memory array 200 are classified into a first set of columns of flash memory cells 100 and a second set of columns of flash memory cells 100, as illustrated in FIG. 2, where the first set of columns lies between the bit lines BL1 and BL2, and the second set of columns lies between the bit lines BL3 and BL4. The first bit source line BLT1 is electrically coupled to gates of the first odd transistor 202 and the second odd transistor 204. The second bit source line BLT2 is electrically coupled to gates of the first even transistor 206 and the second even transistor 208. The first bit line BL1 and the third bit line BL3 are respectively electrically coupled to the first odd transistor 202 and the second odd transistor 204, and are respectively electrically coupled to each flash memory cell 100. The second bit line BL2 and the fourth bit line BL4 are respectively electrically coupled to the first even transistor 206 and the second even transistor 208, and are respectively electrically coupled to each flash memory cell 100. The first word line WL1 and the second word line WL2 are respectively electrically coupled to the control gate 120 of each flash memory cell 100 of a different row of rows of flash memory cells 100 in the flash memory array 200. The first assist gate AG1 is electrically coupled to the select gate of each flash memory cell 100 of the first set of columns of flash memory cells 100 in the flash memory array 200. The second assist gate AG2 is electrically coupled to the select gate of each flash memory cell 100 of the second set of columns of flash memory cells 100 in the flash memory array 200.

The flash memory array 200 shown in FIG. 2 is just an exemplary flash memory array utilizing the MLC technology. There are more flash memory arrays having more flash memory cells 100 than in FIG. 2. Therefore, the number of said flash memory cells 100 in said first set of columns of flash memory cells may be more than in the number shown in FIG. 2, as well as the number of said flash memory cells 100 in said second set of columns of flash memory cells 100. Therefore, the number of corresponding odd transistors, even transistors, bit lines, word lines must also be increased accordingly. During programming, the bit source lines and the assist gates directly correspond to column operations of the first and second sets of columns of flash memory cells 100 in an alternative manner for programming the bits stored in the floating gates 110 and 114 of each flash memory cell 100 in the flash memory array 200.

SUMMARY OF THE INVENTION

The claimed invention provides a method of programming a nonvolatile memory cell formed between a first doping region and a second doping region of a semiconductor substrate. Said nonvolatile memory cell comprises a first conductive line formed above the semiconductor substrate, a first conductive block formed at a first side of the first conductive line and insulated from the first conductive line with a first dielectric spacer, a second conductive block formed at a second side of the first conductive line and insulated from the first conductive line with a second dielectric spacer, a first dielectric layer formed on both of the first conductive block and the second conductive block, and a second conductive line formed on the first dielectric layer and being substantially perpendicular to both of the first doping region and the second doping region. The method comprises applying a high voltage to the second conductive line, applying a low voltage to the first conductive line, applying a first voltage to the first doping region, and applying a second voltage to the second doping region, wherein the first voltage is higher than the second voltage so that a second doping region injects toward the first conductive blocks during programming of said nonvolatile memory cell.

The claimed invention also discloses a method of programming a nonvolatile memory array. The nonvolatile memory array comprises a plurality of nonvolatile memory cells arranged in rows and columns. Each nonvolatile memory cell of the plurality of nonvolatile memory cells comprises a first conductive line formed above the semiconductor substrate, a first conductive block formed at a first side of the first conductive line and insulated from the first conductive line by a first dielectric spacer, a second conductive block formed at a second side of the first conductive line and insulated from the first conductive line by a second dielectric spacer, a first dielectric layer formed on both of the first conductive block and the second conductive block, and a second conductive line formed on the first dielectric layer and being substantially perpendicular to both of the first doping region and the second doping region. A first block transistor is located outside the plurality of memory cells with its source being coupled to the first doping region of each nonvolatile memory cell. A second block transistor is located outside the plurality of memory cells with its drain being coupled to the second doping region of each nonvolatile cell. The disclosed method comprises applying a high voltage to the second conductive line of each nonvolatile memory cell of the nonvolatile memory array; applying a first low voltage to the first conductive line of a first set of columns of memory cells and applying a second low voltage to the first conductive line of a second set of columns of memory cells, columns of the first and second set of columns of memory cells arranged in alternation; applying a first voltage to the drain of the first block transistor; applying a second voltage to the source of the first block transistor; and applying a third voltage to the gates of both the first and second block transistors. The first voltage is higher than the second voltage. Both the first and second block transistors are activated after the third voltage is applied so that the first voltage is transmitted from the drain of the first block transistor to the first doping region of each nonvolatile memory cell, and so that the second voltage is transmitted from the source of the second block transistor to the second doping region of each nonvolatile memory cell.

These and other objectives of the present invention will no doubt become obvious to those of ordinary skill in the art after reading the following detailed description of the preferred embodiment that is illustrated in the various figures and drawings.

DETAILED DESCRIPTION

From the abovementioned descriptions, it is known that a large variation in the threshold voltage $V_{th}$ of a select gate transistor would affect the channel current Ids and the programming speed severely in the SSI injection, especially when the SSI injection is utilized on the flash memory cell 100 and the flash memory array 200 respectively shown in FIG. 1 and FIG. 2. Therefore, a programming method is provided by the present invention for improving the above-mentioned defects and for being utilized on the flash memory cell 100 and the flash memory array 200 respectively shown in FIG. 1 and FIG. 2.

The essence of the programming method of the present invention is keeping the total amount of charge flowing through each flash memory cell 100 constant, thereby, the amount of charge injected into the floating gate of each flash memory cell is also constant. By having the total current flow-through constant, a programming speed of a flash memory cell 100 or a flash memory array 200 stabilizes, and a lower current requirement than in SSI injection is thus achieved by suppressing the variations described above of the SSI injection.

Figure 3:
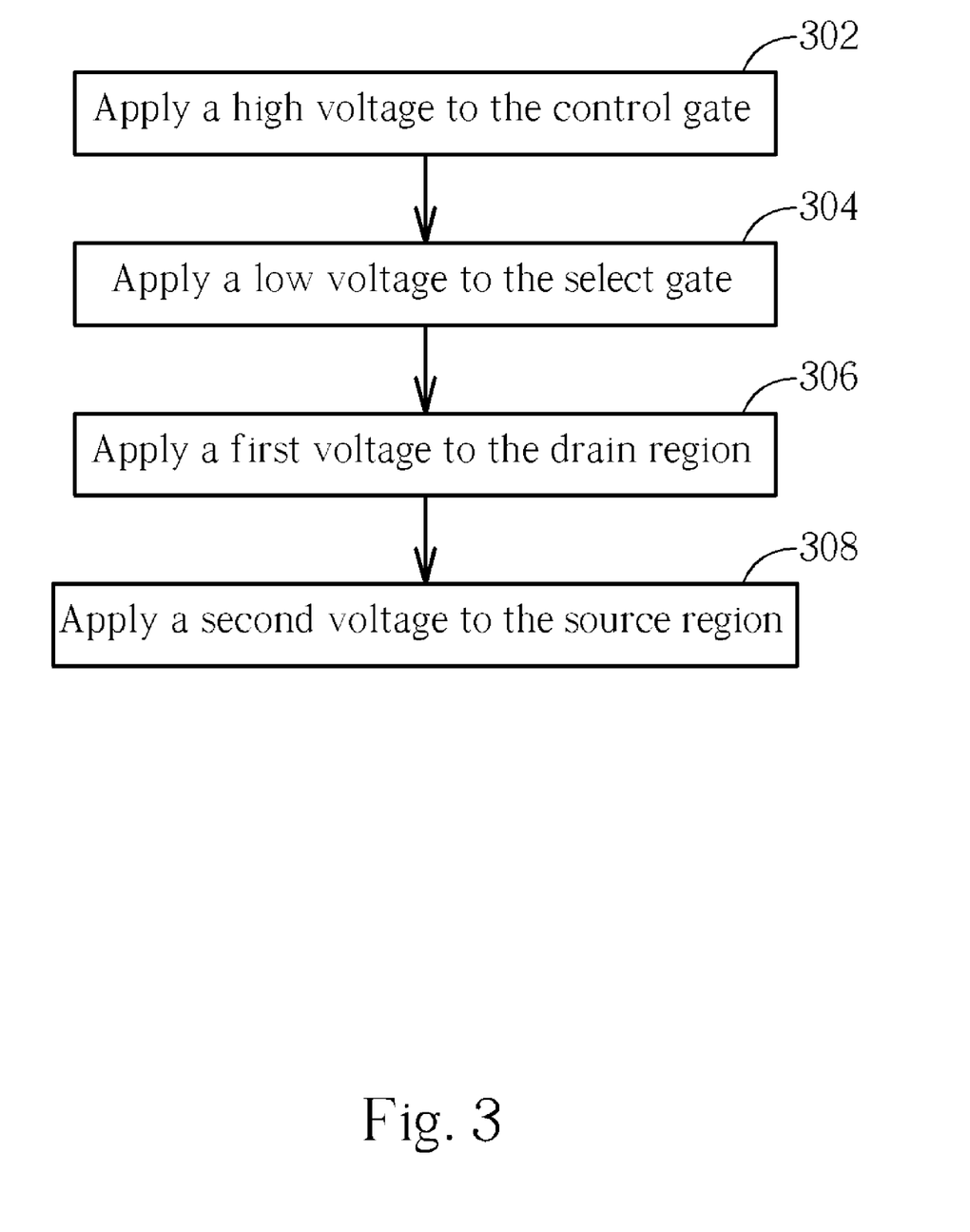
FIG. 3 illustrates the method of programming the flash memory cell shown in FIG. 1 according to the present invention.

Please refer to FIG. 3, which illustrates the method of programming both the floating gates 110 and 114 of the flash memory cell 100 shown in FIG. 1 according to the present invention. The method for programming the flash memory cell 100 shown in FIG. 1 comprises the following steps:

Step 302: Applying a high voltage to the control gate 120.
Step 304: Applying a low voltage to the select gate 108.
Step 306: Applying a first voltage to the drain region 102 while programming the floating gate 114, and applying the first voltage to a source region mutated from the source region 104 while programming the floating gate 110.
Step 308: Applying a second voltage to the source region 104 while programming the floating gate 114, and applying the second voltage to a source region mutated from the drain region 102 while programming the floating gate 110.

The first voltage mentioned in step 306 is higher than the second voltage mentioned in step 308 for generating hot electrons in the channel of the semiconductor substrate 106. While the floating gate 114 is programmed, by applying a low voltage at the select gate 108 and applying a high voltage at the control gate 120, a high electric field is generated on the channel located under the spacer 116 so that electrons on said channel are accelerated. Then the generated hot electrons are dragged into the floating gate 114 by a vertical electric field generated from the control gate 120 to the substrate region 106. Therefore, the charges previous located in the drain region 102 would be transferred as the generated hot electrons and stored on the floating gate 114. After the drain region 102 ceases to be charged, the floating gate 114 also ceases to absorb charges, then the process for programming the floating gate 114 is completed.

When the floating gate 110 is to be programmed, the flowing direction of hot electrons is inverse to the direction during the floating gate 114 is programmed so that the drain region 102 mutates into a drain region, and the source region 104 mutates into a source region. The procedure for programming the floating gate 110 is described as follows. By applying a low voltage at the select gate 108, and by applying a high voltage at the control gate 120, a high electric field is generated on the channel located under the spacer 112 so that electrons on said channel are accelerated. Then the generated hot electrons are dragged into the floating gates 110 by a vertical electric filed from the control gate 120 to the substrate region 106. Therefore, the charges previous located at the drain region mutated from the source region 104 are transferred as hot electrons and stored on the floating gate 110. After the source region mutated from the source region 104 ceases being charged, the floating gate 110 also ceases absorbing charges, and the procedure for programming the floating gate 110 is finished. After programming both the floating gates 110 and 114, a write operation of the flash memory cell 100 is completed.

Figure 4:
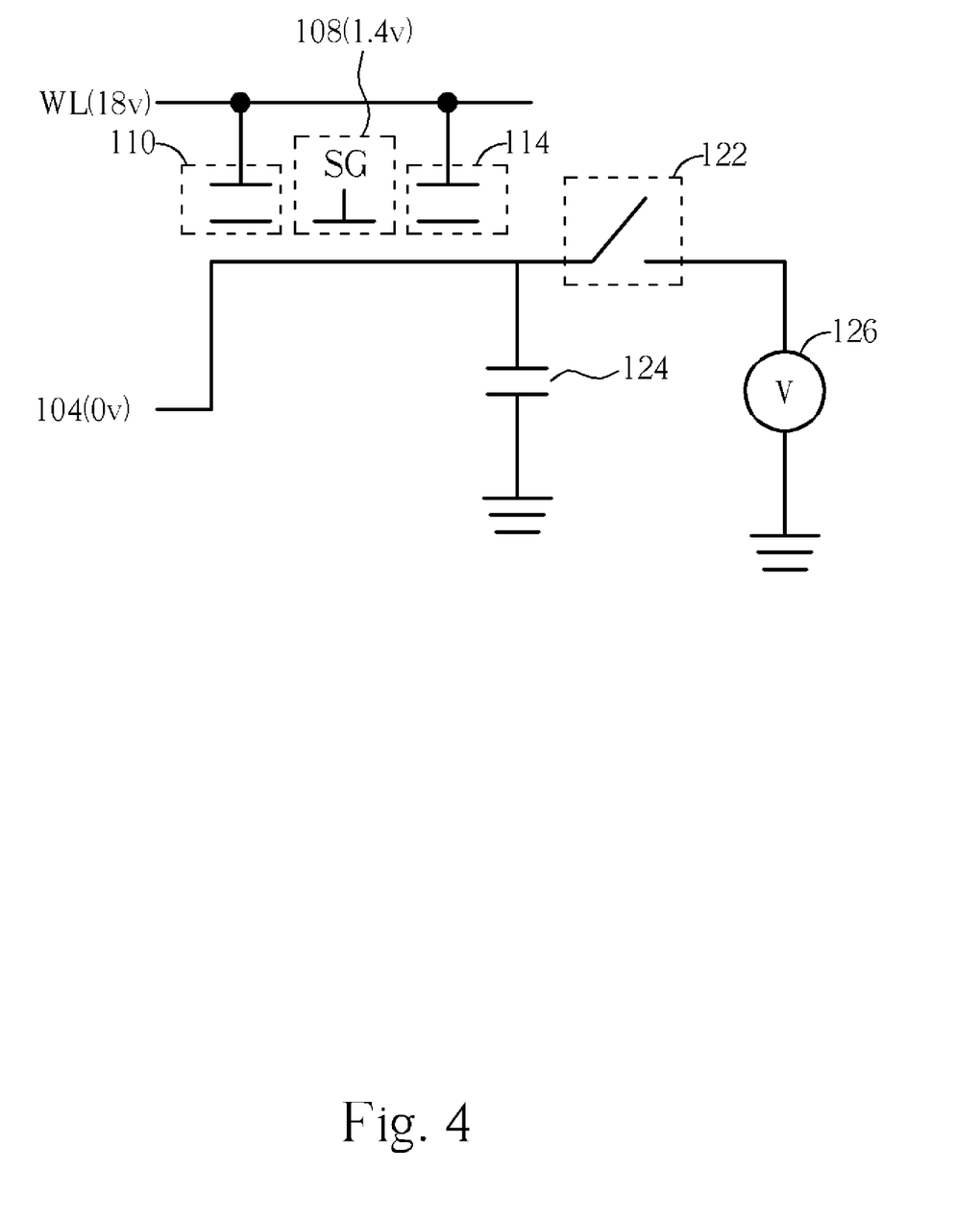
FIG. 4 is a schematic diagram of applying the programming method illustrated in FIG. 3 on the flash memory cell shown in FIG. 1.

Please refer to FIG. 4, which is a schematic diagram of applying the programming method illustrated in FIG. 3 on the flash memory cell 100 shown in FIG. 1. In FIG. 4, a word line WL is electrically coupled to both the floating gates 110 and 114 for biasing the flash memory cell 100. The word line WL also acts as said control gate 120. The drain region 102 of the flash memory cell 100 is further electrically coupled to both a switch 122 and a capacitor 124. The capacitor 124 has a first terminal electrically coupled to the drain region 102 and to the first terminal of the switch 122, and has a second terminal coupled to ground. The switch 122 has a first terminal electrically coupled to both the drain region 102 and the first terminal of the capacitor 124, and has a second terminal coupled to a voltage source 126. The capacitor 124 is utilized for storing charges. When the switch 122 is switched on and a corresponding flash memory cell 100 is turned off (i.e., voltages on both the word line WL and the select gate 108 are 0 volts), a voltage difference stored in the capacitor 124 is charged to reach the first voltage by the voltage source 126. After the charged voltage difference of the capacitor 124 reaches the first voltage, the switch 122 is switched off. After the switch 122 is switched off and the corresponding flash cell 100 is turned on (i.e., the electrical level of the word line WL is 18 volts whereas the electrical level of the select gate 108 is 1.4 volts), the voltage difference stored in the capacitor 124 is discharged into the source region 104, and then hot electrons are injected into the floating gate 114 while programming the floating gate 114. FIG. 4 also illustrates a preferred embodiment of the programming method illustrated in FIG. 3 according to the present invention, wherein the high voltage is 18 volts, the low voltage is 1.4 volts, the first voltage is 4.5 volts, and the second voltage is 0 volts. The value of the low voltage depends on a threshold property of the select gate transistor of the flash memory cell 100. Therefore, the low voltage may be any appropriate voltage for the threshold property, and not be limited to 1.4 volts.

There are two adaptive embodiments for suppressing the above-mentioned variations about SSI injection by the aid of the settings shown in FIG. 4. A first adaptive embodiment takes use of a constant current source. And a second adaptive embodiment takes use of a current mirror.

Figure 5:
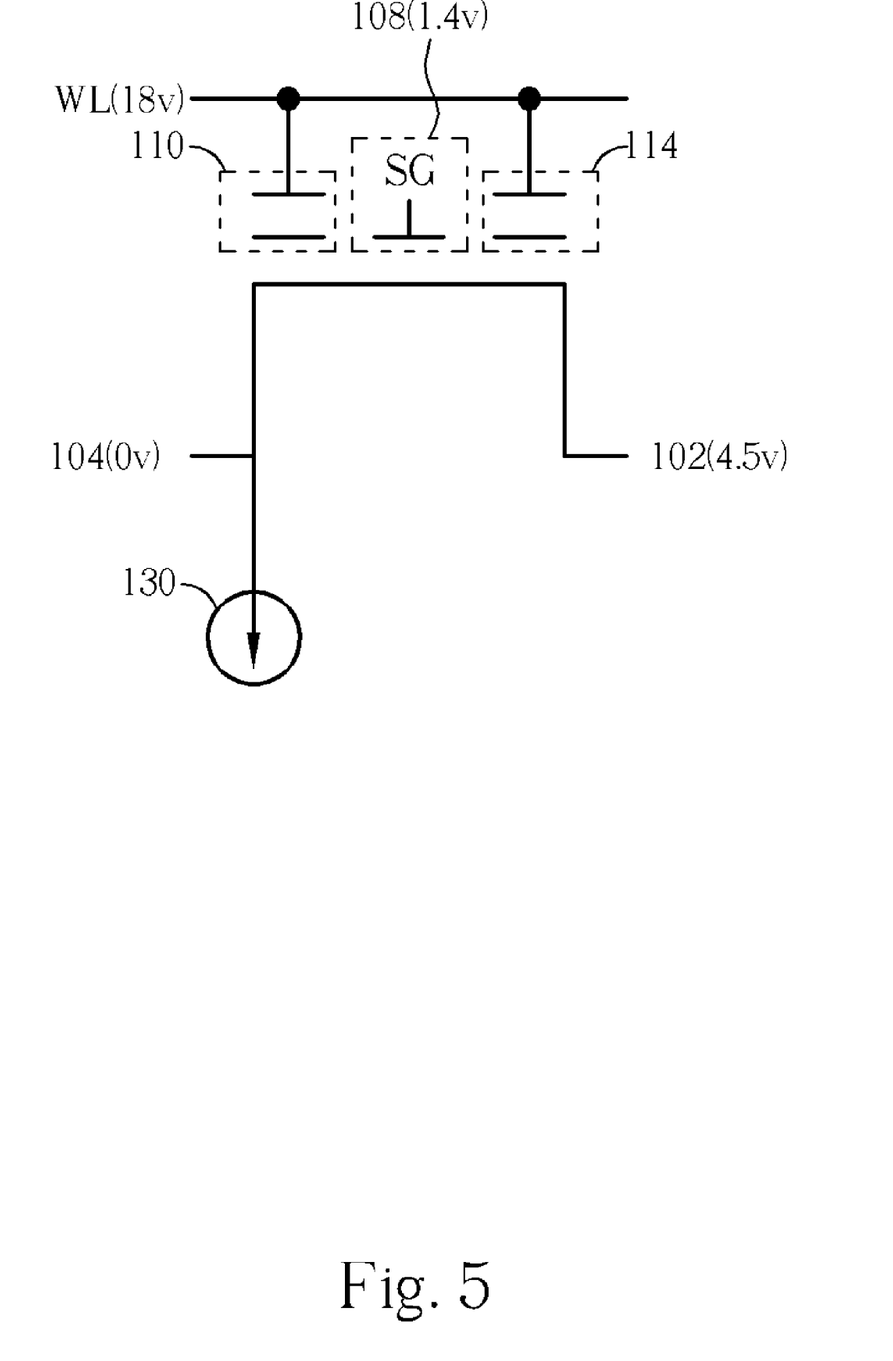
FIG. 5 is a schematic diagram of adding a constant current source to the flash memory cell shown in FIG. 1 according to the settings shown in FIG. 4 and to the programming method illustrated in FIG. 3 of the present invention.

Please refer to FIG. 5, which is a schematic diagram of adding a constant current source to the flash memory cell 100 shown in FIG. 1 according to the settings shown in FIG. 4 and to the programming method illustrated in FIG. 3 of the present invention. In FIG. 5, all the applied voltages are the same with the settings shown in FIG. 4, however, the source region 104 of the flash memory cell 100 is further electrically coupled to a constant current source 130. Note that keeping the total amount of charge flowing through each flash memory cell 100 constant may help suppress the abovementioned variations in the SSI injection. Therefore, with the aid of the constant current source 130, the flash memory cell 100 is more easily biased with a constant current, and the aim of the programming method of the present invention may be more substantially achieved.

Figure 6:
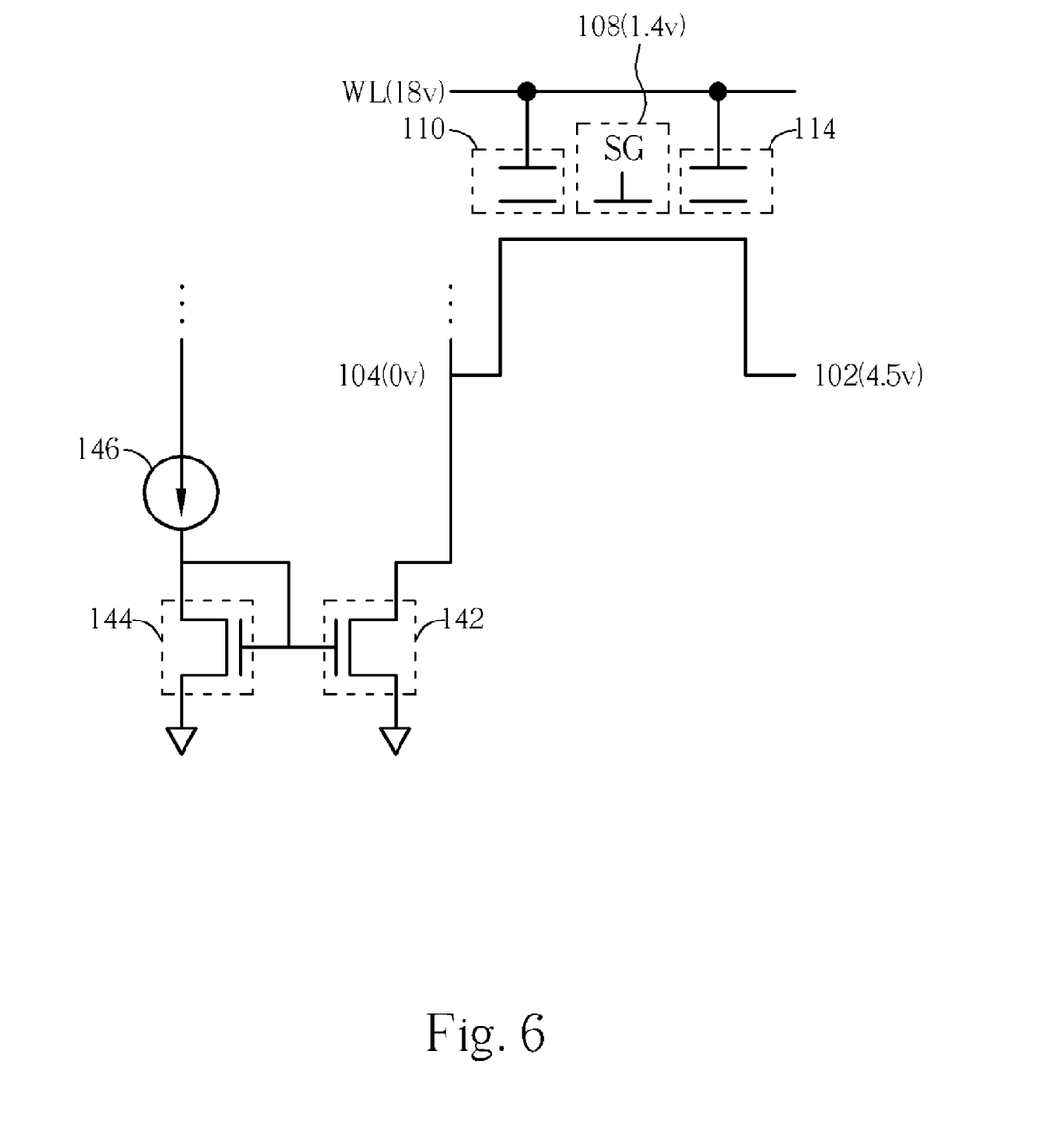
FIG. 6 is a schematic diagram of adding a current mirror equipped with a constant current source on the flash memory cell shown in FIG. 1 according to the settings shown in FIG. 4 and to the programming method illustrated in FIG. 3 of the present invention.

Please refer to FIG. 6, which is a schematic diagram of adding a current mirror equipped with a constant current source on the flash memory cell 100 shown in FIG. 1 according to the settings shown in FIG. 4 and to the programming method illustrated in FIG. 3 of the present invention. In FIG. 6, all the applied voltages are the same with the settings shown in FIG. 4, however, the source region 104 of the flash memory cell 100 is further electrically coupled to a current mirror 140. The current mirror comprises a first transistor 142 and a second transistor 144. The drain of the first transistor 142 is electrically coupled to the source region 104 of the flash memory cell 100. The second transistor 144 has a gate electrically coupled to a gate of the first transistor 142, and has a drain electrically coupled to the gate of the second transistor 144. The drain of the second transistor 144 is electrically coupled to a constant current source 146. Similar with the settings described in FIG. 5, all the applied voltages are the same with the settings shown in FIG. 4, however, the source region 104 of the flash memory cell 100 is further electrically coupled to the current mirror 140 for a more stable biasing constant current of the flash memory cell 100. Therefore, the abovementioned variations in the SSI injection are also suppressed, and the aim of the programming method according to the present invention is thus achieved.

Figure 7:
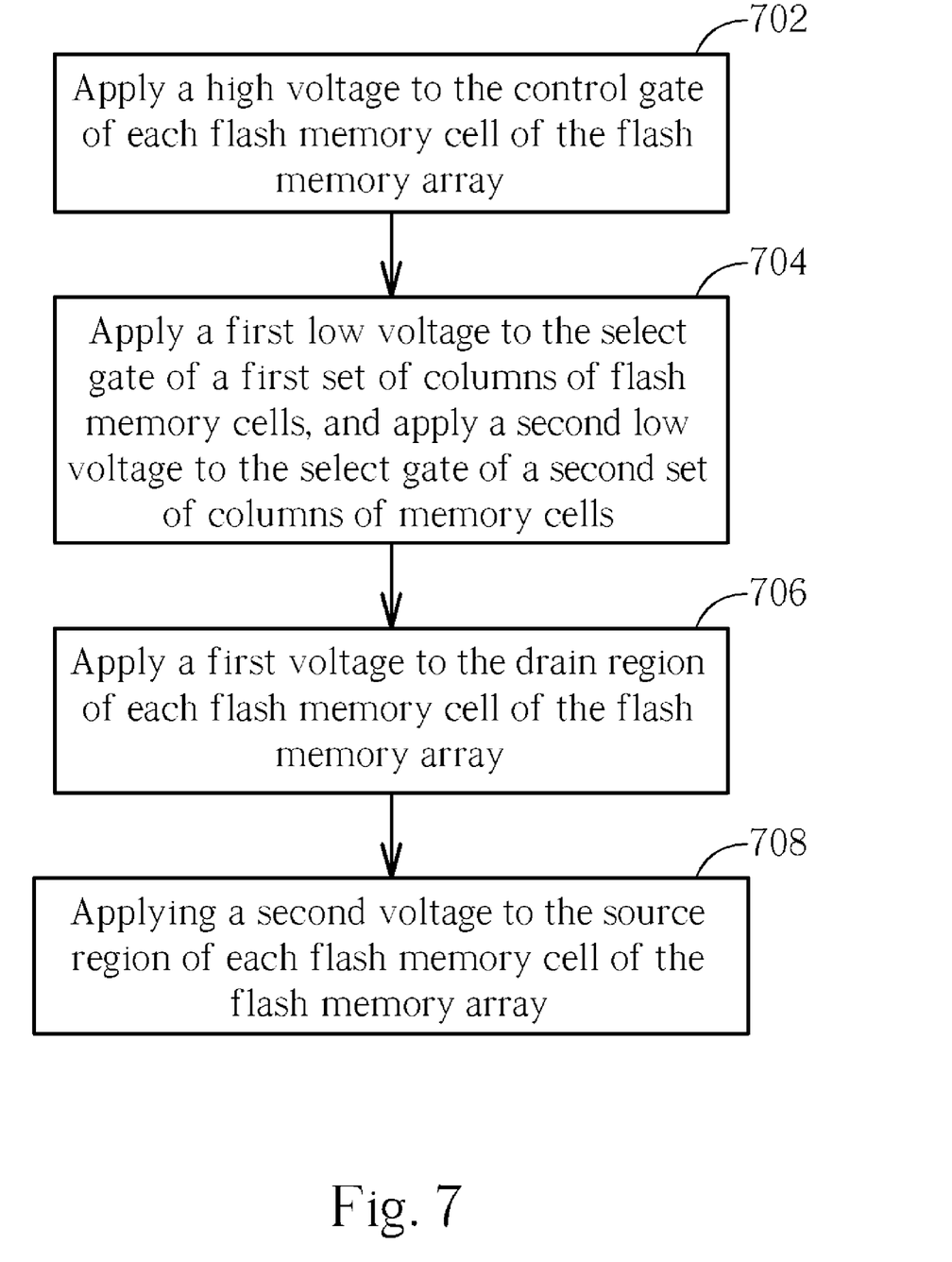
FIG. 7 illustrates the method of programming the flash memory array shown in FIG. 2 according to the present invention.

Please refer to FIG. 7, which illustrates the method of programming the flash memory array 200 shown in FIG. 2 according to the present invention. The method for programming the flash memory array 200 shown in FIG. 2 comprises the following steps:

Step 702: applying a high voltage to the control gate 120 of each flash memory cell 100 of the flash memory array 200.

Step 704: applying a first low voltage to the select gate 108 of a first set of columns of flash memory cells 100, and applying a second low voltage to the select gate 108 of a second set of columns of memory cells, columns of the first set and the second set of columns of flash memory cells 100 being arranged in alternation in the flash memory array 200.

Step 706: applying a first voltage to the drain region 102 of each flash memory cell 100 of the flash memory array 200.

Step 708: applying a second voltage to the source region 104 of each flash memory cell 100 of the flash memory array 200.

The first voltage mentioned in step 706 is higher than the second voltage mentioned in step 708 for generating hot electrons in the channel of the semiconductor substrate 106 of each flash memory cell 100 of the flash memory array 200.

Figure 8:
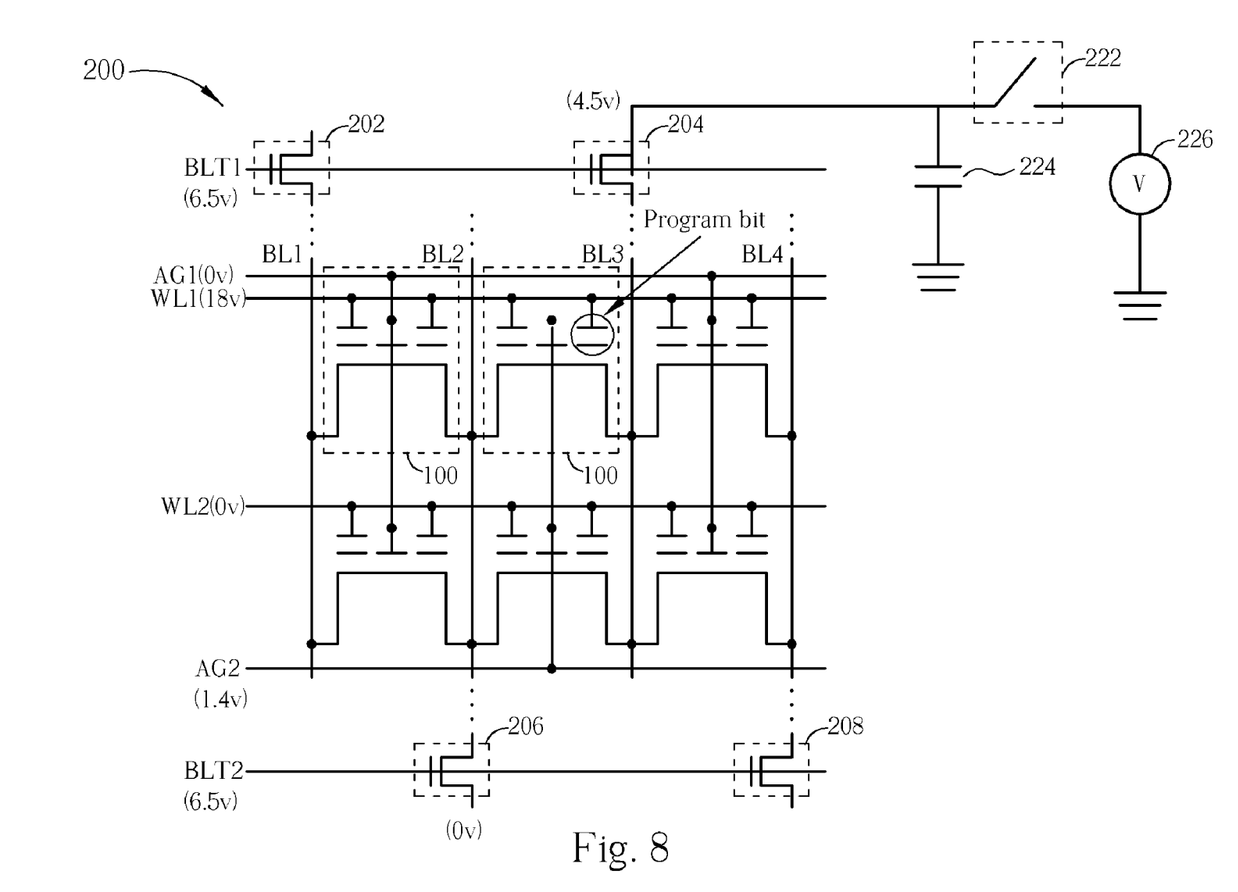
FIG. 8 is a schematic diagram of applying the programming method illustrated in FIG. 7 on the flash memory array shown in FIG. 2.

Please refer to FIG. 8, which is a schematic diagram of applying the programming method illustrated in FIG. 7 on the flash memory array 200 shown in FIG. 2. The programming method illustrated in FIG. 7 is based on the programming method illustrated in FIG. 3, thereby, related array operations have much details in common with the programming method illustrated in FIG. 3. Therefore, please refer to FIG. 1 and FIG. 2 also.

While applying the programming method of FIG. 7 on the flash memory array 200, a high voltage is applied on the control gate 120 of each flash memory cell 100 of a row of the set of rows of flash memory cells 100 through a corresponding word line. A first low voltage is applied on the first assist gate AG1 to select which flash memory cells 100 in each said column are selected to program bits. A second low voltage is applied on the second assist gate AG2 to select which flash memory cells 100 in each said column are unselected to program bits. And therefore, the first low voltage and the second low voltage are applied on the assist gates to select the flash memory cells 100 having bits to be programmed in an alternative-column manner. During programming, a first voltage is applied on the drain region 102 of each flash memory cell 100 in the flash memory array 200 through the first odd transistor 202, i.e., on the bit line BL1, and the second odd transistor 204, i.e., on the bit line BL3. And a second voltage is applied on a source region 104 of each flash memory cell 100 in the flash memory array 200 through the first even transistor 206, i.e., on the bit line BL2, and the second even transistor 208, i.e., on the bit line BL4. Note that the first voltage is higher than the second voltage so that hot electrons may be generated in the semiconductor 106 of each said flash memory cell 100. Therefore, a switch 222 and a capacitor 224 are also applied for providing said constant charges during programming.

In summary of the descriptions about FIG. 8, hot electrons are generated in each said flash memory cell 100, and the generated hot electrons of selected flash memory cells are driven to the floating gate 114 of respective selected flash memory cell 100. With the aid of the capacitor applied to the drain region 102 of each selected flash memory cell having constant charges in one shot of programming, the variant biasing properties between selected flash memory cells 100 are suppressed to a much lower degree.

Figure 9:
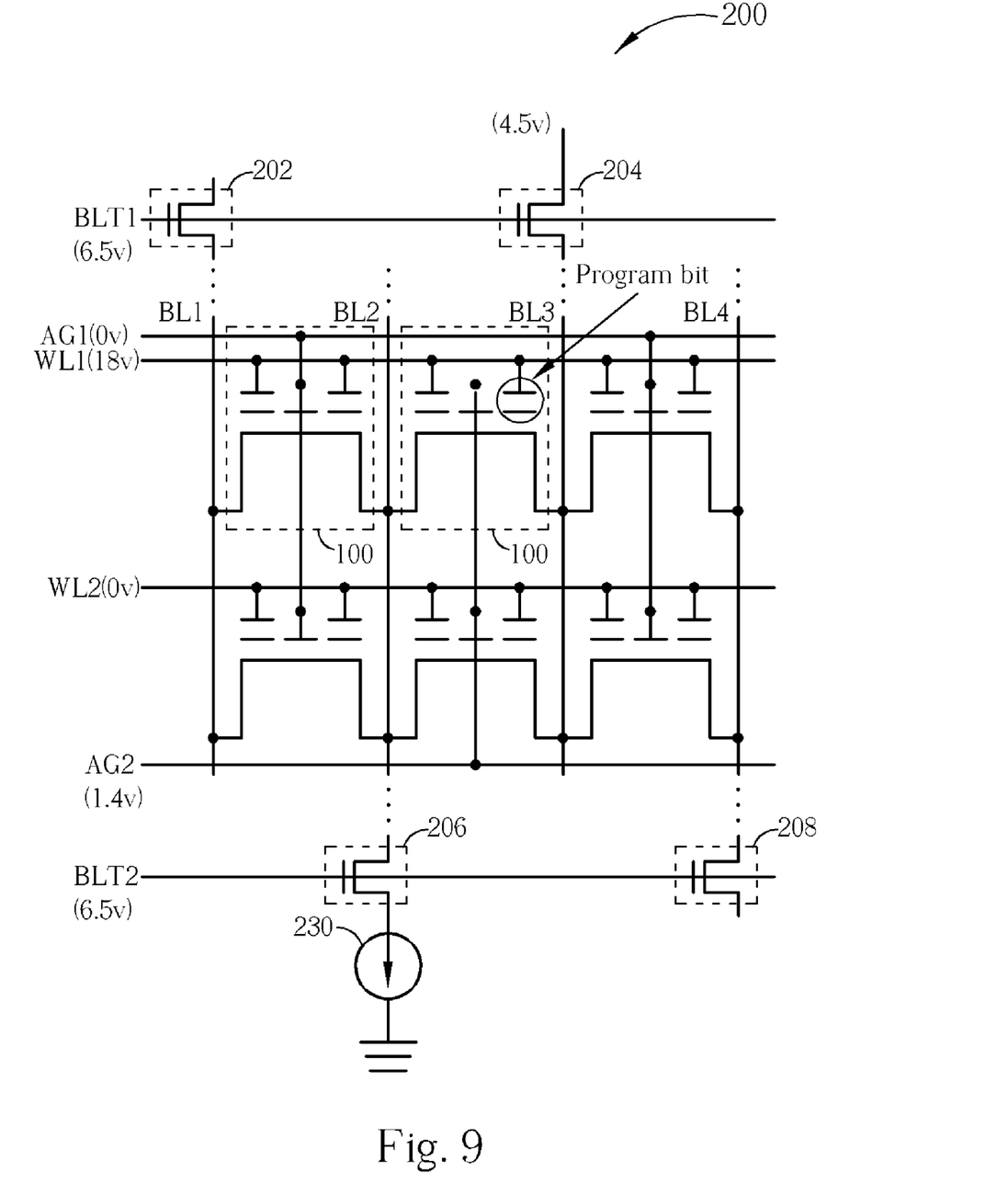
FIG. 9 illustrates a schematic diagram of applying the programming method illustrated in FIG. 7 on the flash memory array shown in FIG. 2 with a constant current source.

FIG. 9 illustrates a schematic diagram of applying the programming method illustrated in FIG. 7 on the flash memory array 200 shown in FIG. 2 with a constant current source. Basically, the programming method applied and shown in FIG. 9 is based on the programming method shown in FIG. 8, and a major difference between FIG. 8 and FIG. 9 is in an additional current source 230 for more easily biasing selected flash memory cells 100 with a constant current, and the aim of suppressing the variations in the SSI injection according to the programming method of the present invention may be more substantially achieved, just as with the descriptions about FIG. 5. Note that the current source 230 may also be replaced with a current mirror equipped with a constant current source according to the descriptions in FIG. 6, and it improves the defects about the SSI injection as well by enhancing the suppression of said variations in biasing properties.

The present invention provides a programming method for programming stored bits in floating gates of a flash memory cell based on the MLC technology, even for all flash memory cells in a flash memory array based on the MLC technology. The programming invention is based on the SSI injection, and improves the defects of the SSI injection. In the programming method of the present invention, a capacitor at the drain region of a selected flash memory cell provides constant charges for suppressing variant biasing properties in using the SSI injection, and the constant charges may be enhanced and maintained with a capacitor and a related switch. The constant charges may also be applied on the drain region of each selected flash memory cell of a flash memory array for achieving said effect. A constant biasing current flowing through a flash memory cell or all flash memory cells in a flash memory array also helps suppress said variations. And the constant biasing current may be implemented with a constant current source or a current mirror equipped with a constant current source for applying on the source region of a selected flash memory cell or the source region of each selected flash memory cell of a flash memory array.

Those skilled in the art will readily observe that numerous modifications and alterations of the device and method may be made while retaining the teachings of the invention.

What is claimed is:

1. A method of programming a nonvolatile memory cell formed between a first doping region and a second doping region of a semiconductor substrate, said nonvolatile memory cell comprising: a first conductive line formed above the semiconductor substrate, a first conductive block formed at a first side of the first conductive line and insulated from the first conductive line with a first dielectric spacer, a second conductive block formed at a second side of the first conductive line and insulated from the first conductive line with a second dielectric spacer, a first dielectric layer formed on both of the first conductive block and the second conductive block, and a second conductive line formed on the first dielectric layer and being substantially perpendicular to both of the first doping region and the second doping region; the method comprising:

applying a high voltage to the second conductive line;
applying a low voltage to the first conductive line;
applying a first voltage to the first doping region; and
applying a second voltage to the second doping region;

wherein the first voltage is higher than the second voltage so that a second doping region injects electrons toward the first conductive blocks during programming of said nonvolatile memory cell.

2. The method of claim 1 wherein the first doping region is a drain region of the semiconductor substrate, and the second doping region is a source region of the semiconductor substrate.

3. The method of claim 1 wherein the first conductive line is a select gate, and the second conductive line is a control gate.

4. The method of claim 1 wherein the first conductive block and the second conductive block are floating gates.

5. The method of claim 1 wherein the high voltage is 18 volts, the low voltage is 1.4 volts, the first voltage is 4.5 volts, and the second voltage is 0 volts.

6. The method of claim 1 wherein the high voltage is 18 volts, the low voltage is a voltage for biasing the nonvolatile cell at a threshold through the first conductive line, which is a select gate, the first voltage is 4.5 volts, and the second voltage is 0 volts.

7. The method of claim 1 farther comprising:
electrically coupling a constant current source to the second doping region for duration of programming the nonvolatile memory cell.

8. The method of claim 1 further comprising:
electrically coupling a current mirror to the second doping region for duration of programming the nonvolatile memory cell;
wherein the current mirror comprises a first transistor, a second transistor; the drain of first transistor electrically coupled to the second doping region; the second transistor has a gate electrically coupled to a gate of the first transistor, and the second transistor has a drain electrically coupled to the gate of the second transistor; the drain of the second transistor electrically coupled to a constant current source.

9. The method of claim 8 wherein the high voltage is 18 volts, the low voltage is 1.4 volts, the first voltage is 4.5 volts, and the second voltage is 0 volts.

10. The method of claim 8 wherein the high voltage is 18 volts, the low voltage is a voltage for biasing the nonvolatile cell at a threshold through the select gate, the first voltage is 4.5 volts, and the second voltage is 0 volts.

11. The method of claim 1 further comprising:
electrically coupling a capacitor and a switch to the first doping region;
coupling the second terminal of the capacitor to ground;
coupling the second terminal of the switch to a constant voltage source;
switching the switch on;
charging the capacitor to a voltage of 4.5 volts;
wherein the high voltage is 0 volts, the low voltage is 0 volts, and the second voltage is 0 volts.

12. The method of claim 11 further comprising:
switching the switch off; and
discharging the capacitor;
wherein the high voltage is 18 volts, the low voltage is 1.4 volts, and the second voltage is 0 volts.

13. The method of claim 1 wherein the nonvolatile memory is a flash EEPROM cell.

* * * * *